US011111433B2

(12) United States Patent
Takahashi et al.

(10) Patent No.: US 11,111,433 B2
(45) Date of Patent: Sep. 7, 2021

(54) TRANSPARENT FLUORESCENT SIALON CERAMIC AND METHOD OF PRODUCING SAME

(71) Applicants: Kanagawa Academy of Science and Technology, Kawasaki (JP); National University Corporation YOKOHAMA National University, Yokohama (JP)

(72) Inventors: Takuma Takahashi, Kawasaki (JP); Junichi Tatami, Yokohama (JP); Yuki Sano, Yokohama (JP); Takehiko Tanaka, Yokohama (JP); Masahiro Yokouchi, Ebina (JP)

(73) Assignees: NATIONAL UNIVERSITY CORPORATION YOKOHAMA NATIONAL UNIVERSITY, Yokohama (JP); KANAGAWA INSTITUTE OF INDUSTRIAL SCIENCE AND TECHNOLOGY, Ebina (JP)

( * ) Notice: Subject to any disclaimer, the term of this patent is extended or adjusted under 35 U.S.C. 154(b) by 973 days.

(21) Appl. No.: 15/123,552

(22) PCT Filed: Mar. 6, 2015

(86) PCT No.: PCT/JP2015/056680
§ 371 (c)(1),
(2) Date: Sep. 2, 2016

(87) PCT Pub. No.: WO2015/133612
PCT Pub. Date: Sep. 11, 2015

(65) Prior Publication Data
US 2017/0073578 A1 Mar. 16, 2017

(30) Foreign Application Priority Data
Mar. 6, 2014 (JP) .............................. JP2014-044430

(51) Int. Cl.
*C09K 11/77* (2006.01)
*C04B 35/597* (2006.01)
(Continued)

(52) U.S. Cl.
CPC ........ *C09K 11/7792* (2013.01); *C04B 35/597* (2013.01); *C04B 35/62625* (2013.01); *C04B 35/62695* (2013.01); *C04B 35/6303* (2013.01); *C04B 35/638* (2013.01); *C04B 35/645* (2013.01); *C09K 11/025* (2013.01); *C09K 11/0883* (2013.01); *C09K 11/7721* (2013.01); *C09K 11/7734* (2013.01); *C09K 11/7774* (2013.01); *C04B 2235/3203* (2013.01); *C04B 2235/3205* (2013.01); *C04B 2235/3217* (2013.01); *C04B 2235/3224* (2013.01); *C04B 2235/3225* (2013.01); *C04B 2235/3244* (2013.01); *C04B 2235/3865* (2013.01); *C04B 2235/3873* (2013.01); *C04B 2235/5436* (2013.01); *C04B 2235/5445* (2013.01);
(Continued)

(58) Field of Classification Search
CPC .............. C09K 11/025; C09K 11/0883; C09K 11/7721; C09K 11/7734; C09K 11/7774; C09K 11/7792; C09K 11/02; C04B 35/597; C04B 35/6303; C04B 35/645; C04B 35/6455; C04B 2235/3201; C04B 2235/3229; C04B 2235/3418; C04B 2235/766; C04B 2235/767; C04B 2235/3203; C04B 2235/3205; C04B 2235/3217; C04B 2235/3224; C04B 2235/3225; C04B 2235/3865; C04B 2235/3873; C04B 2235/604; C04B 2235/658; C04B 2235/661; C04B 2235/965

See application file for complete search history.

(56) References Cited

U.S. PATENT DOCUMENTS 4,693,857 A * 9/1987 Komeya ................ C04B 35/597
264/683
6,023,371 A * 2/2000 Onitsuka .............. C09K 11/025
250/458.1
(Continued)

FOREIGN PATENT DOCUMENTS

CN 1683470 A 10/2005
CN 101103088 A 1/2008
(Continued)

OTHER PUBLICATIONS

Xie et al., "Optical Properties of (Oxy) Nitride Materials: A Review", 2013, J. Am. Ceram. Soc., 96, pp. 665-687. (Year: 2013).*
Office Action issued by the Japanese Patent Office for corresponding Japanese application No. 2016-506190, dated Jan. 4, 2017 (8 pages).
Office Action issued by the Chinese Patent Office for corresponding Chinese application No. 201580011758.8, dated May 4, 2017 (15 pages).
International Search Report issued by the Japanese Patent Office Acting as the International Searching Authority for International Application No. PCT/JP2015/056680, dated May 26, 2015 (4 pages).
(Continued)

*Primary Examiner* — Matthew E. Hoban
*Assistant Examiner* — Lynne Edmondson
(74) *Attorney, Agent, or Firm* — Honigman LLP

(57) ABSTRACT

Provided are a transparent fluorescent sialon ceramic having fluorescence and optical transparency; and a method of producing the same. Such a transparent fluorescent sialon ceramic includes a sialon phosphor which contains a matrix formed of a silicon nitride compound represented by the formula $M_x(Si,Al)_y(N,O)_z$ (here, M represents at least one selected from the group consisting of Li, alkaline earth metals, and rare earth metals, $0 \leq x/z < 3$, and $0 < y/z < 1$) and a luminescent center element.

4 Claims, 5 Drawing Sheets

(51) Int. Cl.
*C04B 35/626* (2006.01)
*C04B 35/645* (2006.01)
*C04B 35/638* (2006.01)
*C04B 35/63* (2006.01)
*C09K 11/02* (2006.01)
*C09K 11/08* (2006.01)
*H01L 33/50* (2010.01)

(52) U.S. Cl.
CPC .. *C04B 2235/604* (2013.01); *C04B 2235/658* (2013.01); *C04B 2235/6562* (2013.01); *C04B 2235/6581* (2013.01); *C04B 2235/6586* (2013.01); *C04B 2235/661* (2013.01); *C04B 2235/9646* (2013.01); *C04B 2235/9653* (2013.01); *H01L 33/502* (2013.01)

(56) References Cited

U.S. PATENT DOCUMENTS

| | | | |
|---|---|---|---|
| 2006/0255716 A1* | 11/2006 | Tsutsumi | B82Y 30/00 313/502 |
| 2008/0165523 A1* | 7/2008 | Schmidt | C09K 11/0883 362/84 |
| 2008/0220260 A1* | 9/2008 | Schmidt | C04B 35/597 428/426 |
| 2010/0142181 A1 | 6/2010 | Schmidt et al. | |
| 2010/0164367 A1* | 7/2010 | Shioi | C04B 35/597 313/503 |
| 2012/0037849 A1 | 2/2012 | Fukuda et al. | |
| 2012/0199858 A1* | 8/2012 | Fuju | H01L 33/507 257/98 |
| 2012/0228551 A1* | 9/2012 | Emoto | C09K 11/0883 252/301.4 R |
| 2015/0044471 A1 | 2/2015 | Ueda et al. | |
| 2015/0362135 A1 | 12/2015 | Sug Iyama | |
| 2017/0073578 A1 | 3/2017 | Takahashi et al. | |

FOREIGN PATENT DOCUMENTS

| | | |
|---|---|---|
| CN | 101697367 A | 4/2010 |
| CN | 102718492 A | 10/2012 |
| CN | 102796522 A | 11/2012 |
| JP | 2004067837 A | 3/2004 |
| JP | 2005008794 | 1/2005 |
| JP | 2005272488 | 10/2005 |
| JP | 2009227714 A | 10/2009 |
| JP | 2010222466 A | 10/2010 |
| JP | 2013142134 | 7/2013 |
| JP | 2013173868 | 9/2013 |
| TW | 200925252 A | 6/2009 |
| WO | WO-2008078285 A2 | 7/2008 |
| WO | WO-2009031089 A1 | 3/2009 |
| WO | 20130147066 | 10/2013 |
| WO | WO-2013172025 A1 | 11/2013 |
| WO | 2014030637 | 2/2014 |
| WO | WO-2017053233 A1 | 3/2017 |

OTHER PUBLICATIONS

Tanaka et al., "Tomei Keiko β-SiAlON Bulk-Tai No Sakusei," The Ceramic Society of Japan Dai 27 Kai Shuki Symposium Koen Yokoshu, Sep. 10, 2014, 2N03.

First Office Action for corresponding Chinese Patent Application No. 201910494876.9 dated Jun. 23, 2021 with English language translation, 26 pages.

* cited by examiner

TRANSPARENT FLUORESCENT SIALON CERAMIC AND METHOD OF PRODUCING SAME

CROSS REFERENCE TO RELATED APPLICATIONS

This application is a 35 USC § 371 United States national stage application of International Application No. PCT/JP2015/056680, filed Mar. 6, 2015, which claims the benefit of priority to Japanese Patent Application No. 2014-044430, filed Mar. 6, 2014, the contents of both of which are incorporated herein by reference, each in its entirety.

TECHNICAL FIELD

The present invention relates to a transparent fluorescent sialon ceramic and a method of producing the same.

BACKGROUND ART

In recent years, blue light-emitting diodes (LED) have come into practical use and white LEDs using these blue LEDs have been developed. Since white LEDs have lower power consumption than white light sources of the related art and have a long lifetime, white LEDs are used for backlights for liquid crystal display devices and indoor and outdoor lighting equipment.

For example, a white LED is obtained by coating the surface of a blue LED with a phosphor or the like (for example, see PTL 1).

CITATION LIST

Patent Literature

[PTL 1] Japanese Unexamined Patent Application, First Publication No. 2013-173868

SUMMARY OF INVENTION

Technical Problem

Since the above-described nitride ceramic phosphor is powdery, the nitride ceramic phosphor is dispersed in a light-transmitting resin and fixed to the surface of a blue LED. In this case, the luminous efficiency of a white LED is degraded due to scattering of light caused by a difference in refractive index between the nitride ceramic phosphor and the resin.

It is considered that such a problem can be solved by obtaining a transparent mass (bulk body) formed of only a nitride ceramic phosphor. In order to make the nitride ceramic phosphor transparent, it is necessary to promote sintering of raw material powder of the nitride ceramic phosphor and to remove pores which are present in a sintered body and become sources of scattered light. Further, since the nitride ceramic phosphor has a high refractive index, the transparency is degraded when a glass phase with a low refractive index remains after firing. However, a method of removing pores from a nitride ceramic phosphor and a method of preventing a glass phase from remaining on the nitride ceramic phosphor have not been established.

The present invention has been made in consideration of the above-described circumstances, and an object thereof is to provide a transparent fluorescent sialon ceramic having fluorescence and light-transmitting properties and a method of producing the same.

Solution to Problem

[1] According to one aspect of the present invention, there is provided a transparent fluorescent sialon ceramic including: a sialon phosphor which contains a matrix formed of a silicon nitride compound represented by the formula $M_x(Si,Al)_y(N,O)_z$ (here, M represents at least one selected from the group consisting of Li, alkaline earth metals, and rare earth metals, $0 \leq x/z < 3$, and $0 < y/z < 1$) and a luminescent center element.

[2] In the transparent fluorescent sialon ceramic according to [1], the silicon nitride compound may be β-sialon represented by the formula $(Si,Al)_6(N,O)_8$.

[3] In the transparent fluorescent sialon ceramic according to [1], the silicon nitride compound may be α-sialon represented by the formula $M_x(Si,Al)_{12}(N,O)_{16}$ (here, M represents at least one selected from the group consisting of Li, alkaline earth metals, and rare earth metals, and $0.3 \leq x \leq 2$).

[4] In the transparent fluorescent sialon ceramic according to [1], the silicon nitride compound may be a compound which is represented by the formula $M_x(Si,Al)_y(N,O)_z$ (here, M represents at least one selected from the group consisting of alkaline earth metals and rare earth metals, $0.2 \leq x/z \leq 0.6$, and $0.4 \leq y/z \leq 0.8$) and has a crystal structure similar to a wurtzite type crystal structure.

[5] In the transparent fluorescent sialon ceramic according to any one of [1] to [4], the luminescent center element may be one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe.

[6] According to another aspect of the present invention, there is provided a method of producing a transparent fluorescent sialon ceramic including: a process of preparing a primary molded body by uniaxial press molding of a mixture which contains at least silicon nitride powder, a substance serving as a luminescent center element source, and a sintering aid; a process of preparing a secondary molded body by cold isostatic press molding of the primary molded body; a process of preparing a sintered body by pre-sintering the secondary molded body in a nitrogen atmosphere; and a process of performing a pressure-sintering treatment to the sintered body on a nitrogen atmosphere. Here, the pre-sintering indicates densifying of the secondary molded body (sintered body) at 0.1 MPa to 1 MPa in a nitrogen atmosphere before pressure sintering. Further, the pressure sintering is a sintering method typified by hot isostatic pressure sintering (HIP sintering), spark plasma sintering (SPS), or a hot press sintering (HP sintering).

[7] According to still another aspect of the present invention, there is provided a method of producing a transparent fluorescent sialon ceramic including: a process of performing a pressure-sintering treatment on a mixture which contains at least silicon nitride powder, a substance serving as a luminescent center element source, and a sintering aid under a nitrogen atmosphere.

[8] In the method of producing a transparent fluorescent sialon ceramic according to [6] or [7], at least one selected from the group consisting of rare earth oxides, alkaline earth metal oxides, aluminum oxide, aluminum nitride, silicon oxide, and hafnium oxide may be used as the sintering aid.

Advantageous Effects of Invention

According to the present invention, it is possible to mold a transparent fluorescent sialon ceramic into a predetermined shape with the form as it is and to apply the molded transparent fluorescent sialon ceramic to a white LED. Further, it is not necessary for a sialon phosphor to be dispersed in a resin for use as in the related art, and it is possible to obtain a transparent fluorescent sialon ceramic in which the luminous efficiency of a white LED is not degraded due to scattering of light caused by a difference in refractive index between a sialon phosphor and a resin.

DESCRIPTION OF EMBODIMENTS

Figure 1:
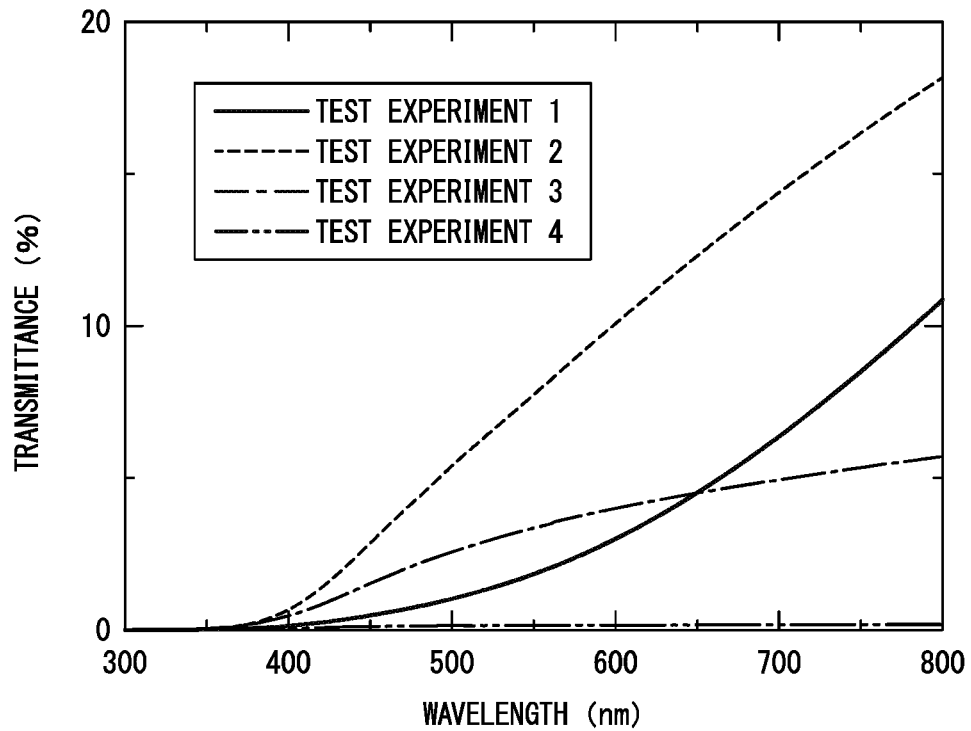
FIG. 1 is a graph showing measurement results of transmittances of visible light in transparent fluorescent sialon ceramics of Experiment Examples 1 to 4.

Embodiments of a transparent fluorescent sialon ceramic of the present invention and a method of producing the same will be described.

Further, the embodiments will be described in detail for better understanding of the scope of the invention and are not intended to limit the present invention unless otherwise noted.

[Transparent Fluorescent Sialon Ceramic]

The transparent fluorescent sialon ceramic of the present embodiment includes a sialon phosphor which contains a matrix formed of a silicon nitride compound represented by the formula $M_x(Si,Al)_y(N,O)_z$ (here, M represents at least one selected from the group consisting of Li, alkaline earth metals, and rare earth metals, $0 \leq x/z < 3$, and $0 < y/z < 1$) and a luminescent center element.

That is, the transparent fluorescent sialon ceramic of the present embodiment includes a sialon phosphor which contains a matrix formed of a silicon nitride compound represented by the formula $M_x(Si,Al)_y(N,O)_z$ (here, M represents at least one selected from the group consisting of Li, alkaline earth metals, and rare earth metals, $0 \leq x/z < 3$, and $0 < y/z < 1$) and a luminescent center element included (present) in the matrix.

The transparent fluorescent sialon ceramic of the present embodiment is a sintered body formed by sintering a raw material containing silicon nitride powder as described below. The transparent fluorescent sialon ceramic is not particulate (powdery), and is a polycrystalline body formed by aggregating plural single crystals of a sialon phosphor and is also a sintered body having an arbitrary shape. The shape of the sintered body is not particularly limited, and examples thereof include a disc-shape, a flat shape, a convex lens shape, a concave lens shape, a spherical shape, a hemispherical shape, a cubic shape, a rectangular parallelepiped shape, a columnar shape such as a prism or a column, and a tubular shape such as a square tube or a cylinder.

For example, in a case where the transparent fluorescent sialon ceramic of the present embodiment is applied to a white LED, the transparent fluorescent sialon ceramic is formed in a shape of covering the outer periphery of a blue LED serving as a light source and then used.

The term "transparent" in the transparent fluorescent sialon ceramic of the present embodiment indicates that the linear transmittance at a wavelength of 800 nm is 10% or greater.

In the formula $M_x(Si,Al)_y(N,O)_z$, in a case where x represents 0, y represents 6, and z represents 8, the silicon nitride compound is β-sialon represented by the formula $(Si,Al)_6(N,O)_8$. In a case where y represents 12 and z represents 16, the silicon nitride compound is α-sialon represented by the formula $M_x(Si,Al)_{12}(N,O)_{16}$ (here, M represents at least one selected from the group consisting of Li, alkaline earth metals, and rare earth metals, and $0.3 \leq x \leq 2$). In a case where M represents Ca, x represents 1, y represents 1, and z represents 2, the silicon nitride compound is $CaSiN_2$. In a case where M represents Ca, x represents 2, y represents 5, and z represents 8, the silicon nitride compound is $Ca_2Si_5N_8$. In a case where M represents Sr, x represents 1, y represents 28, and z represents 32, the silicon nitride compound is $SrSi_9Al_{19}ON_{31}$. In a case where M represents Y, x represents 5, y represents 3, and z represents 13, the silicon nitride compound is $Y_5Si_3O_{12}N$. In a case where M represents Si, x represents 5, y represents 26, and z represents 37, the silicon nitride compound is $Si_5Al_5Si_{21}N_{35}O_2$.

The formula $(Si,Al)_6(N,O)_8$ representing β-sialon is also expressed as the formula $Si_{6-z}Al_zO_zN_{8-z}$ (here, $0 \leq z \leq 4.2$).

In the formula $Si_{6-z}Al_zO_zN_{8-z}$, z is preferably in a range of 0 to 1 and more preferably in a range of 0.01 to 0.5.

The formula $M_x(Si,Al)_{12}(N,O)_{16}$ representing α-sialon is also expressed as the formula $M_xSi_{12-(b+c)}Al_{(b+c)}O_cN_{16-c}$ (here, M represents at least one selected from the group consisting of Li, alkaline earth metals, and rare earth metals, $0.3 \leq x \leq 2$, $3.60 \leq b \leq 5.50$, and $0 \leq c \leq 0.30$).

In the formula $M_xSi_{12-(b+)}Al_{(b+c)}O_cN_{16-c}$, x is preferably in a range of 0.5 to 2. Moreover, in the formula $M_xSi_{12-(b+c)}Al_{(b+c)}O_cN_{16-c}$, b/c is preferably 1.5 or greater.

In addition, in the formula $M_x(Si,Al)_y(N,O)_z$, x/z is preferably in a range of 0.2 to 0.6 and y/z is preferably in a range of 0.4 to 0.8. In a case where x represents 01, y represents 1, and z represents 3, the silicon nitride compound is $CaAlSiN_3$.

In the present embodiment, the silicon nitride compound represented by the formula $M_x(Si,Al)_y(N,O)_z$ is not particularly limited, and any compound can be used as the silicon nitride compound as long as the silicon nitride compound is a compound which emits fluorescence and has light-transmitting properties in a state of containing a luminescent center element by activating the luminescent center element.

As the luminescent center element, one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe is used.

Examples of the metal element M include Li, Ca, Sr, Ba, Y, and lanthanide metals (excluding Ce and La).

The transparent fluorescent sialon ceramic of the present embodiment can emit various fluorescent colors by adjusting the combination of the silicon nitride compound and the luminescent center element. Moreover, the wavelength of light transmitted through the transparent fluorescent sialon ceramic of the present embodiment can be adjusted by combining the silicon nitride compound and the luminescent center element. In this manner, the color tone of the transparent fluorescent sialon ceramic of the present embodiment can be adjusted.

In the transparent fluorescent sialon ceramic of the present embodiment, in a case where the silicon nitride compound is β-sialon activated by Eu, the linear transmittance of visible light is 11% or greater at a wavelength of 800 nm and the fluorescent color which can be emitted is green when the thickness of β-sialon is 100 μm.

Further, in a case where the silicon nitride compound is Y-α-sialon activated by Ce, the linear transmittance of visible light is 65% or greater at a wavelength of 800 nm and the fluorescent color which can be emitted is blue to blue-green when the thickness of Y-α-sialon is 100 μm.

Further, in a case where the silicon nitride compound is Ca-α-sialon activated by Eu, the linear transmittance of visible light is 65% or greater at a wavelength of 800 nm and the fluorescent color which can be emitted is yellow when the thickness of Ca-α-sialon is 100 μm.

Furthermore, in a case where the silicon nitride compound is $CaAlSiN_3$ activated by Eu, the linear transmittance of visible light is 19% or greater at a wavelength of 800 nm and the fluorescent color which can be emitted is red when the thickness of $CaAlSiN_3$ is 100 μm.

In addition, the transparent fluorescent sialon ceramic of the present embodiment is a mass formed of a sialon phosphor containing a matrix formed of a silicon nitride compound and a luminescent center element and can be molded into a predetermined shape with the form as it is and applied to a white LED. Therefore, since it is not necessary for a sialon phosphor to be dispersed in a resin for use as in the related art, the luminous efficiency of a white LED is not degraded due to scattering of light caused by a difference in refractive index between a sialon phosphor and a resin.

Moreover, since the sialon phosphor is uniformly present throughout the entire transparent fluorescent sialon ceramic of the present embodiment, fluorescence is emitted uniformly without being biased and the transmittance of visible light is uniform without being biased.

Further, the transparent fluorescent sialon ceramic of the present embodiment has less pores or glass phases in the inside because the transparent fluorescent sialon ceramic is produced according to the production method described below, and thus the degradation of transparency resulting from the pores or the glass phases is small and light-transmitting properties are excellent.

[Method of Producing Transparent Fluorescent Sialon Ceramic]

The method of producing a transparent fluorescent sialon ceramic of the present embodiment includes a process of preparing a primary molded body by uniaxial press molding of a mixture which contains at least silicon nitride powder, a substance serving as a luminescent center element source, and a sintering aid; a process of preparing a secondary molded body by cold isostatic press molding of the primary molded body; and a process of preparing a sintered body by gas pressure sintering of the secondary molded body in a nitrogen atmosphere.

The method of producing a transparent fluorescent sialon ceramic of the present embodiment is applied to a case where the silicon nitride compound is β-sialon and a case where the silicon nitride compound is α-sialon.

Hereinafter, the method of producing the transparent fluorescent sialon ceramic of the present embodiment will be described by separating the case where the silicon nitride compound is β-sialon from the case where the silicon nitride compound is α-sialon.

[Case where Silicon Nitride Compound is β-Sialon]

First, a mixture of silicon nitride ($Si_3N_4$) powder, aluminum oxide ($Al_2O_3$) powder, aluminum nitride (AlN) powder, a substance serving as a luminescent center element source, and a sintering aid is weighed so as to have a predetermined mass ratio.

As the substance serving as a luminescent center element source, europium (II) oxide (EuO), europium (III) oxide ($Eu_2O_3$), or europium nitride (EuN) is used, for example, in a case where the luminescent center element is Eu.

As the sintering aid, at least one selected from the group consisting of rare earth oxides, alkaline earth metal oxides, aluminum oxide, aluminum nitride, silicon oxide, and hafnium oxide is used, but it is preferable to use a combination of hafnium oxide ($HfO_2$) and yttrium (III) oxide ($Y_2O_3$).

The mixing ratio of the above-described raw material powder is appropriately adjusted according to the fluorescence and light transmitting properties of the target transparent fluorescent sialon ceramic.

Next, a dispersant is added to the raw material powder, wet mixing is performed in ethanol using a ball mill, thereby preparing a slurry containing raw material powder.

Subsequently, the obtained slurry is heated using a heater such as a mantle heater and ethanol contained in the slurry is sufficiently evaporated, thereby obtaining a mixture of raw material powder (mixed powder).

Next, two or more sieves with meshes having sizes different from each other are used in a stepwise manner, the above-described mixed powder is forcedly passed through these sieves, and the mixed powder having a predetermined particle diameter is granulated.

Subsequently, a sufficiently melted binder such as paraffin, a lubricant such as bis(2-ethylhexyl)phthalate, and a solvent such as cyclohexane are sufficiently stirred and mixed with each other, thereby preparing a binder solution.

Next, the granulated mixed powder is added to the binder solution, the binder solution is mixed into the entire mixed powder such that the binder solution permeates into the entire mixed powder, the mixture is heated, and then the solvent is evaporated.

Subsequently, after the solvent is sufficiently evaporated, the mixed powder is forcedly passed through a sieve with meshes having a predetermined size and then granulated powder having a predetermined particle diameter is obtained.

Next, a predetermined amount of granulated powder is collected such that the thickness of a molded body after molding using a mold becomes a predetermined size and then the granulated powder is supplied into the mold.

Subsequently, uniaxial press molding is performed at a pressure of 25 MPa to 50 MPa for 30 seconds using a uniaxial press molding machine, thereby obtaining a primary molded body.

Next, the obtained primary molded body is chamfered and packed in a vacuum pack.

Subsequently, the primary molded body packed in a vacuum pack is molded by cold isostatic pressing (CIP) once or repeatedly ten times at a pressure of 200 MPa for 1 minute using a cold isostatic pressing device, thereby obtaining a secondary molded body.

Next, the secondary molded body is placed on an alumina boat, heated in an air stream of 70 L/min using an annular resistance furnace, and degreased, and a binder included in the secondary molded body is removed. In the degreasing process, the heating temperature and the heating time of the secondary molded body are set in two stages. In the first stage of heating, the heating temperature is set to 250° C. and the heating time is set to 3 hours. In the second stage of heating, the heating temperature is set to 500° C. and the heating time is set to 3 hours.

Moreover, in order to promote evaporation of a binder or a lubricant included in the secondary molded body to some extent or to prevent carbon from remaining due to thermal decomposition of the binder or the lubricant, it is preferable that the heating temperature of the secondary molded body is set to be in a range of 300° C. to 600° C. and the heating time thereof is set to be in a range of 1 hour to 10 hours.

Next, the degreased secondary molded body is pre-sintered in a nitrogen atmosphere using a multi-purpose high-temperature sintering furnace, thereby obtaining a sintered body.

In order to sinter the secondary molded body, a porous crucible made of $Si_3N_4$, which is prepared by reaction sintering, is disposed in a housing made of carbon, a porous column plate made of $Si_3N_4$ is disposed in the crucible, and the secondary molded body is disposed in the column plate shape.

In this sintering process, the temperature is increased at 20° C./min in a vacuum ($6.7 \times 10^{-2}$ Pa or less) in a temperature range of room temperature to 1200° C., the secondary molded body is pressed by nitrogen gas up to 0.25 MPa at 1200° C. and pressed with a nitrogen gas flow of 4 L/min up to 0.9 MPa while the temperature is increased at 10° C./min until the temperature reaches the target sintering temperature from 1200° C. The sintering temperature of the secondary molded body is set to be in a range of 1600° C. to 1900° C. and the sintering time is set to 2 hours. Further, the pressure at the time of sintering is set to be in a range of 0.88 MPa to 0.91 MPa in a nitrogen atmosphere.

Next, after the sintering is finished, the sintered body is left to be naturally cooled to room temperature and then cooled.

Subsequently, the sintered body is subjected to a pressure-sintering treatment at a pressure of 50 MPa to 200 MPa and a temperature of 1700° C. to 1800° C. for 1 hour in a nitrogen atmosphere using a hot isostatic pressing (HIP) device.

In this manner, the transparent fluorescent sialon ceramic of the present embodiment is obtained.

According to the method of producing the transparent fluorescent sialon ceramic of the present embodiment, it is possible to remove a region having a different refractive index and serving as a source of scattered light and a glass phase serving as a light absorbing source by performing a process of preparing a secondary molded body by cold isostatic press molding of the primary molded body; a process of preparing a sintered body by pre-sintering the secondary molded body in a nitrogen atmosphere; and a process of performing a pressure-sintering treatment on the sintered body in a nitrogen atmosphere. As a result, since the sialon phosphor is uniformly present throughout the entire obtained transparent fluorescent sialon ceramic, fluorescence is emitted uniformly without being biased and the transmittance of visible light is uniform without being biased. Further, the transparent fluorescent sialon ceramic has less pores or glass phases in the inside and thus there is no degradation of transparency resulting from the pores or the glass phases and light-transmitting properties are excellent. Particularly, the effect of removing pores and glass phases is improved by means of using hafnium oxide ($HfO_2$) having a refractive index close to that of β-sialon, in addition to yttrium (III) oxide ($Y_2O_3$), as a sintering aid and thus a transparent fluorescent sialon ceramic having more excellent light transmitting properties is obtained.

[Case where Silicon Nitride Compound is Y-α-Sialon]

First, a mixture of silicon nitride ($Si_3N_4$) powder, aluminum nitride (AlN) powder, a substance serving as a luminescent center element source, and a sintering aid is weighed so as to have a predetermined mass ratio.

As the substance serving as a luminescent center element source, cerium (IV) oxide ($CeO_2$) is used, for example, in a case where the luminescent center element is Ce.

As the sintering aid, at least one selected from the group consisting of rare earth oxides, alkaline earth metal oxides, aluminum oxide, aluminum nitride, and silicon oxide is used, but it is preferable to use a combination of aluminum nitride (AlN) and yttrium (III) oxide ($Y_2O_3$).

The mixing ratio of the above-described raw material powder is appropriately adjusted according to the fluorescence and light transmitting properties of the target transparent fluorescent sialon ceramic.

Next, a dispersant is added to the raw material powder, wet mixing is performed in ethanol using a ball mill, thereby preparing a slurry containing raw material powder.

Subsequently, the obtained slurry is heated using a heater such as a mantle heater and ethanol contained in the slurry is sufficiently evaporated, thereby obtaining a mixture of raw material powder (mixed powder).

Next, two or more sieves with meshes having sizes different from each other are used in a stepwise manner, the above-described mixed powder is forcedly passed through these sieves, and the mixed powder having a predetermined particle diameter is granulated.

Subsequently, a sufficiently melted binder such as paraffin, a lubricant such as bis(2-ethylhexyl)phthalate, and a solvent such as cyclohexane are sufficiently stirred and mixed with each other, thereby preparing a binder solution.

Next, the granulated mixed powder is added to the binder solution, the binder solution is mixed into the entire mixed powder such that the binder solution permeates into the entire mixed powder, the mixture is heated, and then the solvent is evaporated.

Subsequently, after the solvent is sufficiently evaporated, the mixed powder is forcedly passed through a sieve with meshes having a predetermined size and then granulated powder having a predetermined particle diameter is obtained.

Next, a predetermined amount of granulated powder is collected such that the thickness of a molded body after molding using a mold becomes a predetermined size and then the granulated powder is supplied into the mold.

Subsequently, uniaxial press molding is performed at a pressure of 50 MPa for 30 seconds using a uniaxial press molding machine, thereby obtaining a primary molded body.

Next, the obtained primary molded body is chamfered and packed in a vacuum pack.

Subsequently, the primary molded body packed in a vacuum pack is molded by cold isostatic pressing (CIP) once or repeatedly ten times at a pressure of 200 MPa for 1 minute using a cold isostatic pressing device, thereby obtaining a secondary molded body.

Next, the secondary molded body is placed on an alumina boat, heated in an air stream of 70 L/min using an annular resistance furnace, and degreased, and a binder included in the secondary molded body is removed. In the degreasing process, the heating temperature and the heating time of the secondary molded body are set in two stages. In the first stage of heating, the heating temperature is set to 500° C. and the heating time is set to 3 hours. In the second stage of heating, the heating temperature is set to 560° C. and the heating time is set to 3 hours.

Moreover, in order to promote evaporation of a binder or a lubricant included in the secondary molded body to some extent or to prevent carbon from remaining due to thermal decomposition of the binder or the lubricant, it is preferable that the heating temperature of the secondary molded body is set to be in a range of 300° C. to 600° C. and the heating time thereof is set to be in a range of 1 hour to 10 hours.

Next, the degreased secondary molded body is pre-sintered in a nitrogen atmosphere using a multi-purpose high-temperature sintering furnace, thereby obtaining a sintered body.

In order to sinter the secondary molded body, a porous crucible made of $Si_3N_4$, which is prepared by reaction sintering, is disposed in a housing made of carbon, a porous column plate made of $Si_3N_4$ is disposed in the crucible, and the secondary molded body is disposed in the column plate shape.

In this sintering process, the temperature is increased at 20° C./min in a vacuum ($6.7 \times 10^{-2}$ Pa or less) in a temperature range of room temperature to 1200° C., the secondary molded body is pressed by nitrogen gas up to 0.25 MPa at 1200° C. and pressed with a nitrogen gas flow of 4 L/min up to 0.9 MPa while the temperature is increased at 10° C./min until the temperature reaches the target sintering temperature from 1200° C. The sintering temperature of the secondary molded body is set to 1600° C. and the sintering time is set to 2 hours. Further, the pressure at the time of sintering is set to be in a range of 0.88 MPa to 0.91 MPa in a nitrogen atmosphere.

Next, after the sintering is finished, the sintered body is left to be naturally cooled to room temperature and then cooled.

Subsequently, the sintered body is subjected to a pressure-sintering treatment at a pressure of 50 MPa to 200 MPa and a temperature of 1600° C. to 1800° C. for 1 hour in a nitrogen atmosphere using a hot isostatic pressing (HIP) device.

In this manner, the transparent fluorescent sialon ceramic of the present embodiment is obtained.

According to the method of producing the transparent fluorescent sialon ceramic of the present embodiment, it is possible to remove a region having a different refractive index and serving as a source of scattered light and a glass phase serving as a light absorbing source by performing a process of preparing a secondary molded body by cold isostatic press molding of the primary molded body; a process of preparing a sintered body by pre-sintering the secondary molded body in a nitrogen atmosphere; and a process of performing a pressure-sintering treatment on the sintered body in a nitrogen atmosphere. As a result, since the sialon phosphor is uniformly present throughout the entire obtained transparent fluorescent sialon ceramic, fluorescence is emitted uniformly without being biased and the transmittance of visible light is uniform without being biased. Further, the transparent fluorescent sialon ceramic has less pores or glass phases in the inside and thus there is no degradation of transparency resulting from the pores or the glass phases and light-transmitting properties are excellent.

[Case where Silicon Nitride Compound is Ca-α-Sialon]

First, a mixture of silicon nitride ($Si_3N_4$) powder, aluminum nitride (AlN) powder, a substance serving as a luminescent center element source, and a sintering aid is weighed so as to have a predetermined mass ratio.

As the substance serving as a luminescent center element source, europium (III) oxide ($Eu_2O_3$) is used, for example, in a case where the luminescent center element is Eu.

As the sintering aid, at least one selected from the group consisting of rare earth oxides, alkaline earth metal oxides, aluminum oxide, aluminum nitride, silicon oxide, and hafnium oxide is used, but it is preferable to use a combination of aluminum nitride (AlN) and calcium carbonate ($CaCO_3$).

The mixing ratio of the above-described raw material powder is appropriately adjusted according to the fluorescence and light transmitting properties of the target transparent fluorescent sialon ceramic.

Next, a dispersant is added to the raw material powder and wet mixing is performed in ethanol using a ball mill, thereby preparing a slurry containing raw material powder.

Subsequently, the obtained slurry is heated using a heater such as a mantle heater and ethanol contained in the slurry is sufficiently evaporated, thereby obtaining a mixture of raw material powder (mixed powder).

Next, two or more sieves with meshes having sizes different from each other are used in a stepwise manner, the above-described mixed powder is forcedly passed through these sieves, and the mixed powder having a predetermined particle diameter is granulated.

Subsequently, a sufficiently melted binder such as paraffin, a lubricant such as bis(2-ethylhexyl)phthalate, and a solvent such as cyclohexane are sufficiently stirred and mixed with each other, thereby preparing a binder solution.

Next, the granulated mixed powder is added to the binder solution, the binder solution is mixed into the entire mixed powder such that the binder solution permeates into the entire mixed powder, the mixture is heated, and then the solvent is evaporated.

Subsequently, after the solvent is sufficiently evaporated, the mixed powder is forcedly passed through a sieve with meshes having a predetermined size and then granulated powder having a predetermined particle diameter is obtained.

Next, a predetermined amount of granulated powder is collected such that the thickness of a molded body after molding using a mold becomes a predetermined size and then the granulated powder is supplied into the mold.

Subsequently, uniaxial press molding is performed at a pressure of 50 MPa for 30 seconds using a uniaxial press molding machine, thereby obtaining a primary molded body.

Next, the obtained primary molded body is chamfered and packed in a vacuum pack.

Subsequently, the primary molded body packed in a vacuum pack is molded by cold isostatic pressing (CIP) once or repeatedly ten times at a pressure of 200 MPa for 1 minute using a cold isostatic pressing device, thereby obtaining a secondary molded body.

Next, the secondary molded body is placed on an alumina boat, heated in an air stream of 70 L/min using an annular resistance furnace, and degreased, and a binder included in the secondary molded body is removed. In the degreasing process, the heating temperature and the heating time of the secondary molded body are set in two stages. In the first stage of heating, the heating temperature is set to 500° C. and the heating time is set to 3 hours. In the second stage of heating, the heating temperature is set to 560° C. and the heating time is set to 3 hours.

Moreover, in order to promote evaporation of a binder or a lubricant included in the secondary molded body to some extent or to prevent carbon from remaining due to thermal decomposition of the binder or the lubricant, it is preferable that the heating temperature of the secondary molded body is set to be in a range of 300° C. to 600° C. and the heating time thereof is set to be in a range of 1 hour to 10 hours.

Next, the degreased secondary molded body is pre-sintered in a nitrogen atmosphere using a multi-purpose high-temperature sintering furnace, thereby obtaining a sintered body.

In order to sinter the secondary molded body, a porous crucible made of $Si_3N_4$, which is prepared by reaction sintering, is disposed in a housing made of carbon, a porous column plate made of $Si_3N_4$ is disposed in the crucible, and the secondary molded body is disposed in the column plate shape.

In this sintering process, the temperature is increased at 20° C./min in a vacuum ($6.7 \times 10^{-2}$ Pa or less) in a temperature range of room temperature to 1200° C., the secondary molded body is pressed by nitrogen gas up to 0.25 MPa at 1200° C. and pressed with a nitrogen gas flow of 4 L/min up to 0.9 MPa while the temperature is increased at 10° C./min until the temperature reaches the target sintering temperature from 1200° C. The sintering temperature of the secondary molded body is set to 1600° C. and the sintering time is set to 2 hours. Further, the pressure at the time of sintering is set to be in a range of 0.88 MPa to 0.91 MPa in a nitrogen atmosphere.

Next, after the sintering is finished, the sintered body is left to be naturally cooled to room temperature and then cooled.

Subsequently, the sintered body is subjected to a pressure-sintering treatment at a pressure of 50 MPa to 200 MPa and a temperature of 1600° C. to 1800° C. for 1 hour in a nitrogen atmosphere using a hot isostatic pressing (HIP) device.

In this manner, the transparent fluorescent sialon ceramic of the present embodiment is obtained.

According to the method of producing the transparent fluorescent sialon ceramic of the present embodiment, it is possible to remove a region having a different refractive index and serving as a source of scattered light and a glass phase serving as a light absorbing source by performing a process of preparing a secondary molded body by cold isostatic press molding of the primary molded body; a process of preparing a sintered body by pre-sintering the secondary molded body in a nitrogen atmosphere; and a process of performing a pressure-sintering treatment on the sintered body in a nitrogen atmosphere. As a result, since the sialon phosphor is uniformly present throughout the entire obtained transparent fluorescent sialon ceramic, fluorescence is emitted uniformly without being biased and the transmittance of visible light is uniform without being biased. Further, the transparent fluorescent sialon ceramic has less pores or glass phases in the inside and thus there is no degradation of transparency resulting from the pores or the glass phases and light-transmitting properties are excellent.

[Method of Producing Transparent Fluorescent Sialon Ceramic]

The method of producing a transparent fluorescent sialon ceramic of the present embodiment includes a process of performing a pressure-sintering treatment on a mixture which contains at least silicon nitride powder, a substance serving as a luminescent center element source, and a sintering aid in a nitrogen atmosphere.

The method of producing the transparent fluorescent sialon ceramic of the present embodiment is applied to a case where the silicon nitride compound is a compound which is represented by the formula $M_x(Si,Al)_y(N,O)_z$ (here, M represents at least one selected from the group consisting of alkaline earth metals and rare earth metals, $0.2 \le x/z \le 0.6$, and $0.4 \le y/z \le 0.8$) and has a crystal structure similar to a wurtzite type crystal structure.

First, silicon nitride ($Si_3N_4$) powder, calcium nitride ($Ca_3N_2$) powder, aluminum nitride (AlN) powder, and a substance serving as a luminescent center element source are weighed so as to have a predetermined mass ratio.

As the substance serving as a luminescent center element source, europium (II) oxide (EuO), europium (III) oxide ($Eu_2O_3$), or europium nitride (EuN) is used, for example, in a case where the luminescent center element is Eu.

The mixing ratio of the above-described raw material powder is appropriately adjusted according to the fluorescence and light transmitting properties of the target transparent fluorescent sialon ceramic.

Next, the raw material powder is dry-mixed using a ball mill and, for example, a glass bottle is filled with the obtained mixed powder. The operations of weighing, mixing and filling of the raw material powder are all carried out in a glove box.

Subsequently, the mixed powder fills the bottle in a graphitic type. During the sintering, in order to prevent graphite from being mixed into the sample, a boron nitride plate is interposed between a punch bar of graphite and the sample.

Next, the mixture in the graphitic type is subjected to a pulse conduction pressure-sintering treatment in a nitrogen atmosphere.

The pulse conduction pressure-sintering treatment is carried out under the conditions in a temperature range of 1600° C. to 1800° C. at a pressure of 10 MPa to 200 MPa for a holding time of 1 minute to 60 minutes.

In this manner, the transparent fluorescent sialon ceramic of the present embodiment is obtained.

According to the method of producing the transparent fluorescent sialon ceramic of the present embodiment, it is possible to remove a region having a different refractive index and serving as a light scattering source and a glass phase serving as a light absorbing source by performing a process of performing a pulse conduction pressure-sintering treatment on the mixture which contains at least silicon nitride powder, a substance serving as a luminescent center element source, and a sintering aid in a nitrogen atmosphere. As a result, since the sialon phosphor is uniformly present throughout the entire obtained transparent fluorescent sialon ceramic, fluorescence is emitted uniformly without being biased and the transmittance of visible light is uniform without being biased. Further, the transparent fluorescent sialon ceramic has less pores or glass phases in the inside and thus there is no degradation of transparency resulting from the pores or the glass phases and light-transmitting properties are excellent.

The transparent fluorescent sialon ceramic of the present embodiment can be applied to light emitting devices such as a light emitting diode (LED), a fluorescent lamp, and a scintillator; display devices such as a television and a display device for a personal computer; and sensors.

In the related art, since a phosphor is supplied in a powder form, it was difficult to apply a phosphor to a field in which a single crystal is used such as a scintillator. However, the transparent fluorescent sialon ceramic of the present embodiment is a sintered body that forms any shape and thus can be widely applied to the field in which a single crystal is used.

Moreover, a YAG transparent phosphor bulk body of the related art has a problem in the temperature characteristic. That is, it is reported that emission intensity of the YAG transparent phosphor bulk body is decreased with an increase in temperature. On the contrary, in the case of the transparent fluorescent sialon ceramic of the present embodiment, quenching caused by an increase of temperature is extremely small. That is, a light emitting device with excellent color rendering properties or the like can be realized using the transparent fluorescent sialon ceramic of the present embodiment.

EXAMPLES

Hereinafter, the present invention will be described in more detail with reference to experiment examples, but the present invention is not limited to the following experiment examples.

Experiment Example 1

(Production of Transparent Fluorescent Sialon Ceramic)

First, silicon nitride ($Si_3N_4$) powder (trade name: SN-E10, manufactured by UBE INDUSTRIES, LTD., purity >98%, average particle diameter: 0.6 μm), aluminum oxide ($Al_2O_3$) powder (trade name: AKP-30, manufactured by Sumitomo Chemical Company, Ltd.), aluminum nitride (AlN) powder (manufactured by Tokuyama Corporation, F grade, purity >98%, average particle diameter: 1.29 μm), europium (III) oxide ($Eu_2O_3$) (manufactured by Shin-Etsu Chemical Co., Ltd.), yttrium (III) oxide ($Y_2O_3$) (trade name: RU-P, manufactured by Shin-Etsu Chemical Co., Ltd., purity >99.9%, average particle diameter: 1.1 μm), and hafnium oxide ($HfO_2$) (trade name: HFE01PB, manufactured by KOJUNDO CHEMICAL LABORATORY CO., LTD.) were weighed so as to have a mass ratio of 92:1.5:2.5:1:2.5:5 (=$Si_3N_4$:$Al_2O_3$:AlN:$Eu_2O_3$:$Y_2O_3$:$HfO_2$).

Next, 2% by mass of a dispersant (trade name: SERNA E503, manufactured by CHUKYO YUSHI CO., LTD., polyacrylic acid) was added to the total amount of the raw material powder, wet mixing was performed in ethanol at a rotation speed of 110 rpm for 48 hours using a ball mill (pot: made of silicon nitride, internal volume: 400 mL, sialon ball: particle diameter of 5 mm, 1400 pieces), thereby preparing a slurry containing raw material powder.

Subsequently, the obtained slurry was heated using a heater such as a mantle heater and ethanol contained in the slurry was sufficiently evaporated, thereby obtaining a mixture of raw material powder (mixed powder).

Next, a sieve of #32 (nominal dimension: 500 μm) and a sieve of #48 (nominal dimension: 300 μm) were used in this order, the above-described mixed powder was forcedly passed through these sieves, and the mixed powder having a predetermined particle diameter was granulated.

Subsequently, sufficiently melted paraffin (manufactured by Junsei Chemical Co., Ltd., melting point of 46° C. to 48° C.) as a binder, bis(2-ethylhexyl)phthalate (manufactured by Wako Pure Chemical Industries, Ltd., purity of 97.0%) as a lubricant, and cyclohexane (manufactured by Wako Pure Chemical Industries, Ltd., purity of 99.5%) as a solvent were sufficiently stirred and mixed with each other, thereby preparing a binder solution. Here, the amount of paraffin to be added was set to 4% by mass and the amount of bis(2-ethylhexyl)phthalate to be added was set to 2% by mass with respect to the total amount of raw material powder. Further, the amount of cyclohexane to be added was set to 35 mL/100 g.

Next, the granulated mixed powder was added to the binder solution, the binder solution was mixed into the entire mixed powder such that the binder solution permeated into the entire mixed powder, the mixture was heated, and then the solvent was evaporated.

Subsequently, after the solvent was sufficiently evaporated, the mixed powder was forcedly passed through a sieve of #60 (nominal dimension: 250 μm) and then granulated powder having a predetermined particle diameter was obtained.

Next, 0.7 g of granulated powder was collected such that the thickness of a molded body after molding using a stainless steel mold in a cylindrical shape having a diameter of 15 mm became 2 mm and then the granulated powder was supplied into the mold.

Subsequently, uniaxial press molding was performed at a pressure of 500 MPa for 30 seconds using a uniaxial press molding machine (trade name: MP-500H, manufactured by MARUTO INSTRUMENT CO., LTD.), thereby obtaining a primary molded body.

Next, the obtained primary molded body was chamfered and packed in a vacuum pack.

Subsequently, the primary molded body packed in a vacuum pack was molded by cold isostatic pressing once or repeatedly ten times at a pressure of 200 MPa for 60 seconds using a cold isostatic pressing device (trade name: SE-HANDY CIP50-2000, manufactured by Applied Power Japan, Ltd.), thereby obtaining a secondary molded body.

Next, the secondary molded body was placed on an alumina boat, heated in an air stream of 70 L/min using a tabular resistance furnace, and degreased, and a binder included in the secondary molded body was removed. In the degreasing process, heating was carried out at 500° C. for 3 hours and heating was carried out at 560° C. for 3 hours.

Moreover, in order to promote evaporation of a binder or a lubricant included in the secondary molded body to some extent or to prevent carbon from remaining due to thermal decomposition of the binder or the lubricant, the secondary molded body was heated at 250° C. for 3 hours.

Next, the degreased secondary molded body was pre-sintered in a nitrogen atmosphere using a multi-purpose high-temperature sintering furnace (trade name: HIGH MULTI 5000, manufactured by Fujidempa Kogyo Co., Ltd.), thereby obtaining a sintered body.

In order to sinter the secondary molded body, a porous crucible made of $Si_3N_4$, which was prepared by reaction sintering, was disposed in a housing made of carbon, a porous column plate made of $Si_3N_4$ was disposed in the crucible, and the secondary molded body was disposed on the column plate.

In this sintering process, the temperature was increased at 20° C./min in a vacuum ($6.7 \times 10^{-2}$ Pa or less) in a temperature range of room temperature to 1200° C., the secondary molded body was pressed by nitrogen gas up to 0.25 MPa at 1200° C. and pressed with a nitrogen gas flow of 4 L/min up to 0.9 MPa while the temperature was increased at 10° C./min from 1200° C. to 1600° C. The sintering temperature of the secondary molded body was set to 1600° C. and the sintering time was set to 2 hours. Further, the pressure at the time of sintering was set to be in a range of 0.88 to 0.91 MPa in a nitrogen atmosphere.

Next, after the sintering was finished, the sintered body was left to be naturally cooled to room temperature and then cooled.

Subsequently, the sintered body was subjected to a pressure-sintering treatment at 100 MPa and 1700° C. for 1 hour in a nitrogen atmosphere using a hot isostatic pressing processing device (trade name: SYSTEM15X, manufactured by KOBE STEEL LTD.), thereby obtaining a transparent fluorescent sialon ceramic of Experiment Example 1.

The shape of the transparent fluorescent sialon ceramic of Experiment Example 1 was columnar. Further, the transparent fluorescent sialon ceramic of Experiment Example 1 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 1, the linear transmittance of visible light was measured.

The transmittance of visible light was measured by fixing a sample having a thickness of 100 μm to a jig with tape and setting the measurement wavelength region to be in a range of 300 nm to 800 nm using LAMBDA 750 (manufactured by Perkin Elmer Co., Ltd.). The results are shown in Table 1 and FIG. 1.

(Measurement of Emission Spectrum and Excitation Spectrum)

With respect to the transparent fluorescent sialon ceramic of Experiment Example 1, the emission spectrum and the excitation spectrum were measured.

Figure 2:
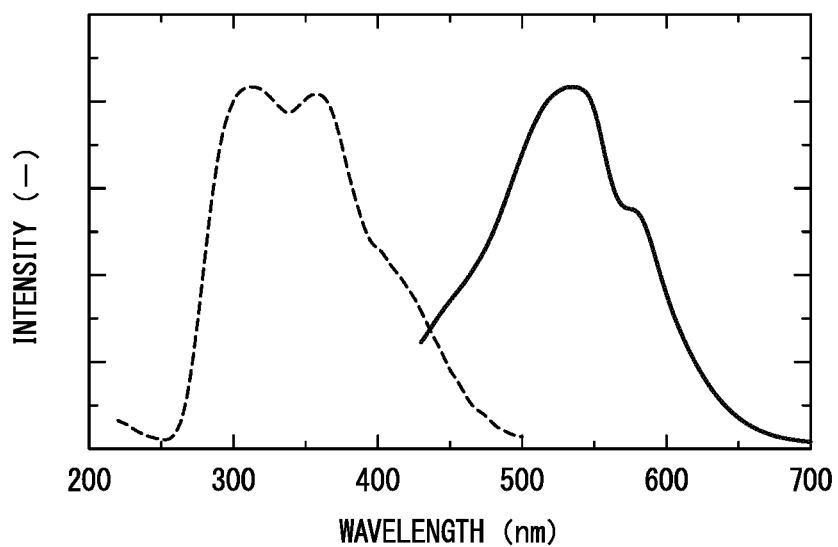
FIG. 2 is a graph showing measurement results of an emission spectrum and an excitation spectrum in the transparent fluorescent sialon ceramic of Experiment Example 1.

In measurement of the emission spectrum and the excitation spectrum, the measurement wavelength region was set such that the emission spectrum was excited at 405 nm and was in a range of 430 nm to 700 nm and the excitation spectrum was excited at 540 nm and was in a range of 280 nm to 500 nm (under a 270 nm cut-off filter) using FP6300 (manufactured by Jasco Corporation). The results thereof are shown in FIG. 2.

Experiment Example 2

(Production of Transparent Fluorescent Sialon Ceramic)

A transparent fluorescent sialon ceramic of Experiment Example 2 was obtained in the same manner as in Experiment Example 1 except that silicon nitride ($Si_3N_4$) powder, aluminum oxide ($Al_2O_3$) powder, aluminum nitride (AlN) powder, europium (III) oxide ($Eu_2O_3$), yttrium (III) oxide ($Y_2O_3$), and hafnium oxide ($HfO_2$) were weighed so as to have a mass ratio of 92:1.5:3.5:1:2.5:5 (=$Si_3N_4$:$Al_2O_3$:AlN: $Eu_2O_3$:$Y_2O_3$:$HfO_2$).

The shape of the transparent fluorescent sialon ceramic of Experiment Example 2 was columnar. Further, the transparent fluorescent sialon ceramic of Experiment Example 2 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 2, the linear transmittance of visible light was measured in the same manner as in Experiment Example 1. The results are shown in Table 1 and FIG. 1.

(Measurement of Emission Spectrum and Excitation Spectrum)

Figure 3:
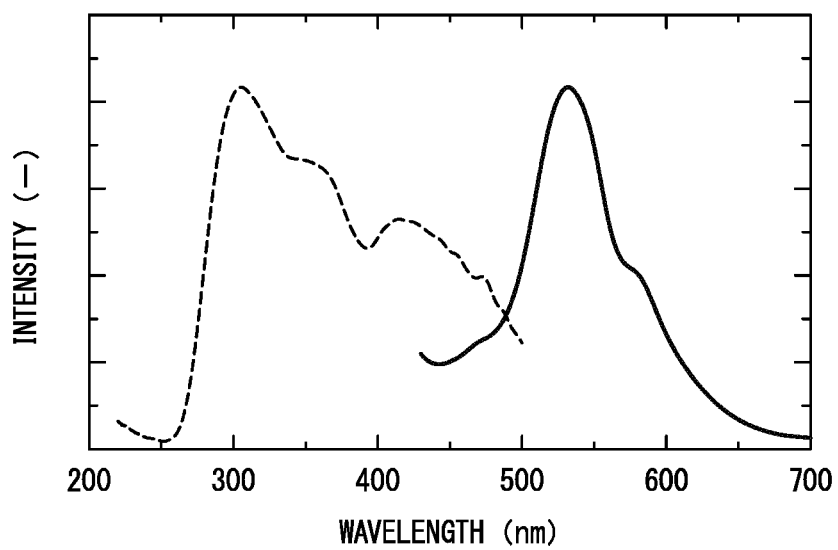
FIG. 3 is a graph showing measurement results of an emission spectrum and an excitation spectrum in the transparent fluorescent sialon ceramic of Experiment Example 2.

With respect to the transparent fluorescent sialon ceramic of Experiment Example 2, the emission spectrum and the excitation spectrum were measured in the same manner as in Experiment Example 1. The results thereof are shown in FIG. 3.

Experiment Example 3

(Production of Transparent Fluorescent Sialon Ceramic)

A transparent fluorescent sialon ceramic of Experiment Example 3 was obtained in the same manner as in Experiment Example 1 except that silicon nitride ($Si_3N_4$) powder, aluminum oxide ($Al_2O_3$) powder, aluminum nitride (AlN) powder, europium (III) oxide ($Eu_2O_3$), yttrium (III) oxide ($Y_2O_3$), and hafnium oxide ($HfO_2$) were weighed so as to have a mass ratio of 92:1.5:5:1:2.5:5 (=$Si_3N_4$:$Al_2O_3$:AlN: $Eu_2O_3$:$Y_2O_3$:$HfO_2$).

The shape of the transparent fluorescent sialon ceramic of Experiment Example 3 was columnar. Further, the transparent fluorescent sialon ceramic of Experiment Example 3 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 3, the linear transmittance of visible light was measured in the same manner as in Experiment Example 1. The results are shown in FIG. 1.

(Measurement of Emission Spectrum and Excitation Spectrum)

Figure 4:
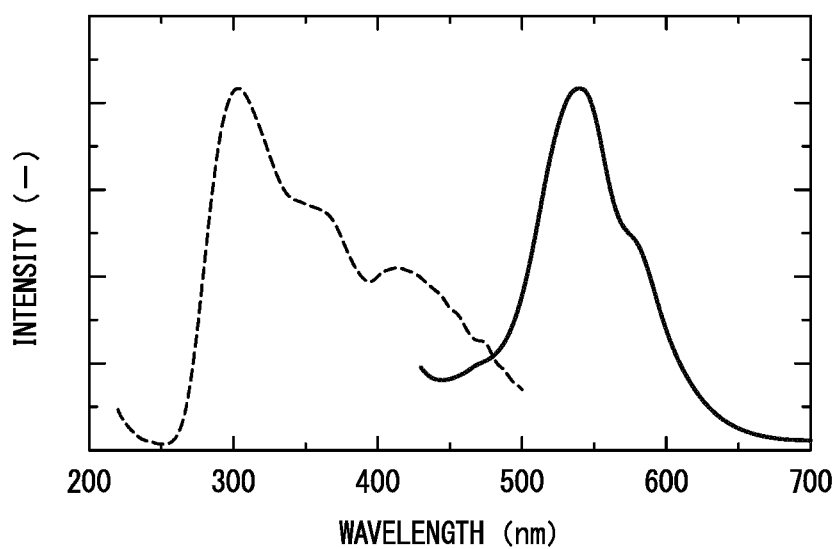
FIG. 4 is a graph showing measurement results of an emission spectrum and an excitation spectrum in the transparent fluorescent sialon ceramic of Experiment Example 3.

With respect to the transparent fluorescent sialon ceramic of Experiment Example 3, the emission spectrum and the excitation spectrum were measured in the same manner as in Experiment Example 1. The results thereof are shown in FIG. 4.

Experiment Example 4

(Production of Transparent Fluorescent Sialon Ceramic)

A transparent fluorescent sialon ceramic of Experiment Example 4 was obtained in the same manner as in Experiment Example 1 except that silicon nitride ($Si_3N_4$) powder, aluminum oxide ($Al_2O_3$) powder, aluminum nitride (AlN) powder, europium (III) oxide ($Eu_2O_3$), yttrium (III) oxide ($Y_2O_3$), and hafnium oxide ($HfO_2$) were weighed so as to have a mass ratio of 92:1.5:1.5:1:2.5:5 (=$Si_3N_4$:$Al_2O_3$:AlN: $Eu_2O_3$:$Y_2O_3$:$HfO_2$).

The shape of the transparent fluorescent sialon ceramic of Experiment Example 4 was columnar. Further, the transparent fluorescent sialon ceramic of Experiment Example 4 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 4, the linear transmittance of visible light was measured in the same manner as in Experiment Example 1. The results are shown in FIG. 1.

(Measurement of Emission Spectrum and Excitation Spectrum)

Figure 5:
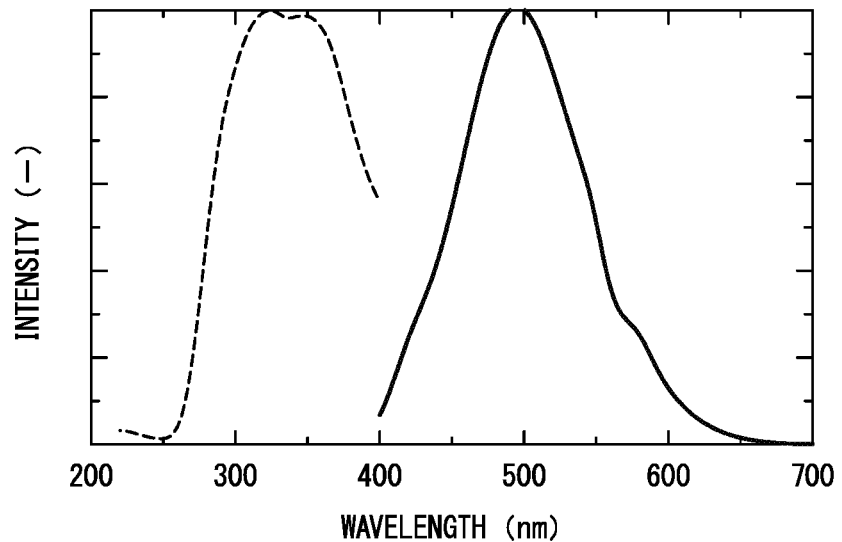
FIG. 5 is a graph showing measurement results of an emission spectrum and an excitation spectrum in the transparent fluorescent sialon ceramic of Experiment Example 4.

With respect to the transparent fluorescent sialon ceramic of Experiment Example 4, the emission spectrum and the excitation spectrum were measured in the same manner as in Experiment Example 1. The results thereof are shown in FIG. 5.

Experiment Example 5

(Production of Transparent Fluorescent Sialon Ceramic)

First, silicon nitride ($Si_3N_4$) powder (trade name: SN-E10, manufactured by UBE INDUSTRIES, LTD., purity >98%, average particle diameter: 0.6 μm), aluminum nitride (AlN) powder (manufactured by Tokuyama Corporation, F grade, purity >98%, average particle diameter: 1.29 μm), cerium (IV) oxide ($CeO_2$) (manufactured by Shin-Etsu Chemical Co., Ltd.), and yttrium (III) oxide ($Y_2O_3$) (trade name: RU-P, manufactured by Shin-Etsu Chemical Co., Ltd., purity >99.9%, average particle diameter: 1.1 μm) were weighed so as to have a molar ratio of 21:9:0.2:0.9 (=$Si_3N_4$:AlN:$CeO_2$:$Y_2O_3$).

Next, 2% by mass of a dispersant (trade name: SERNA E503, manufactured by CHUKYO YUSHI CO., LTD., polyacrylic acid) was added to the total amount of the raw material powder, wet mixing was performed in ethanol at a rotation speed of 110 rpm for 48 hours using a ball mill (pot: made of silicon nitride, internal volume: 400 mL, sialon ball: particle diameter of 5 mm, 1400 pieces), thereby preparing a slurry containing raw material powder.

Subsequently, the obtained slurry was heated using a heater such as a mantle heater and ethanol contained in the slurry was sufficiently evaporated, thereby obtaining a mixture of raw material powder (mixed powder).

Next, a sieve of #32 (nominal dimension: 500 μm) and a sieve of #48 (nominal dimension: 300 μm) were used in this order, the above-described mixed powder was forcedly passed through these sieves, and the mixed powder having a predetermined particle diameter was granulated.

Subsequently, sufficiently melted paraffin (manufactured by Junsei Chemical Co., Ltd., melting point of 46° C. to 48° C.) as a binder, bis(2-ethylhexyl)phthalate (manufactured by Wako Pure Chemical Industries, Ltd., purity of 97.0%) as a lubricant, and cyclohexane (manufactured by Wako Pure Chemical Industries, Ltd., purity of 99.5%) as a solvent were sufficiently stirred and mixed with each other, thereby preparing a binder solution. Here, the amount of paraffin to be added was set to 4% by mass and the amount of bis(2-ethylhexyl)phthalate to be added was set to 2% by mass with respect to the total amount of raw material powder. Further, the amount of cyclohexane to be added was set to 35 mL/100 g.

Next, the granulated mixed powder was added to the binder solution, the binder solution was mixed into the entire mixed powder such that the binder solution permeated into the entire mixed powder, the mixture was heated, and then the solvent was evaporated.

Subsequently, after the solvent was sufficiently evaporated, the mixed powder was forcedly passed through a sieve of #60 (nominal dimension: 250 μm) and then granulated powder having a predetermined particle diameter was obtained.

Next, 0.7 g of granulated powder was collected such that the thickness of a molded body after molding using a stainless steel mold in a cylindrical shape having a diameter of 15 mm became 2 mm and then the granulated powder was supplied into the mold.

Subsequently, uniaxial press molding was performed at a pressure of 500 MPa for 30 seconds using a uniaxial press molding machine (trade name: MP-500H, manufactured by MARUTO INSTRUMENT CO., LTD.), thereby obtaining a primary molded body.

Next, the obtained primary molded body was chamfered and packed in a vacuum pack.

Subsequently, the primary molded body packed in a vacuum pack was molded by cold isostatic pressing once at a pressure of 200 MPa for 60 seconds using a cold isostatic pressing device (trade name: SE-HANDY CIP50-2000, manufactured by Applied Power Japan, Ltd.), thereby obtaining a secondary molded body.

Next, the secondary molded body was placed on an alumina boat, heated in an air stream of 70 L/min using a tabular resistance furnace, and degreased, and a binder included in the secondary molded body was removed. In the degreasing process, heating was carried out at 500° C. for 3 hours and heating was carried out at 560° C. for 3 hours.

Moreover, in order to promote evaporation of a binder or a lubricant included in the secondary molded body to some extent or to prevent carbon from remaining due to thermal decomposition of the binder or the lubricant, the secondary molded body was heated at 250° C. for 3 hours.

Next, the degreased secondary molded body was pre-sintered in a nitrogen atmosphere using a multi-purpose high-temperature sintering furnace (trade name: HIGH MULTI 5000, manufactured by Fujidempa Kogyo Co., Ltd.), thereby obtaining a sintered body.

In order to sinter the secondary molded body, a porous crucible made of $Si_3N_4$, which was prepared by reaction sintering, was disposed in a housing made of carbon, a porous column plate made of $Si_3N_4$ was disposed in the crucible, and the secondary molded body was disposed on the column plate.

In this sintering process, the temperature was increased at 20° C./min in a vacuum ($6.7 \times 10^{-2}$ Pa or less) in a temperature range of room temperature to 1200° C., the secondary molded body was pressed by nitrogen gas up to 0.25 MPa at 1200° C. and pressed with a nitrogen gas flow of 4 L/min up to 0.9 MPa while the temperature was increased at 10° C./min from 1200° C. to 1600° C. The sintering temperature of the secondary molded body was set to 1600° C. and the sintering time was set to 2 hours. Further, the pressure at the time of sintering was set to be in a range of 0.88 to 0.91 MPa in a nitrogen atmosphere.

Next, after the sintering was finished, the sintered body was left to be naturally cooled to room temperature and then cooled.

Subsequently, the sintered body was subjected to a pressure-sintering treatment at 100 MPa and 1600° C. for 1 hour in a nitrogen atmosphere using a hot isostatic pressing processing device (trade name: SYSTEM15X, manufactured by KOBE STEEL LTD.), thereby obtaining a transparent fluorescent sialon ceramic of Experiment Example 5.

The shape of the transparent fluorescent sialon ceramic of Experiment Example 5 was columnar. Further, the transparent fluorescent sialon ceramic of Experiment Example 5 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 5, the linear transmittance of visible light was measured in the same manner as in Experiment Example 1. The results are shown in Table 1 and FIG. 6.

(Measurement of Emission Spectrum and Excitation Spectrum)

With respect to the transparent fluorescent sialon ceramic of Experiment Example 5, the emission spectrum and the excitation spectrum were measured in the same manner as in Experiment Example 1. The measurement results of the emission wavelength peak and the excitation wavelength peak are listed in Table 1.

Experiment Example 6

(Production of Transparent Fluorescent Sialon Ceramic)

A transparent fluorescent sialon ceramic of Experiment Example 6 was obtained in the same manner as in Experiment Example 5 except that a secondary molded body was obtained by performing cold isostatic press molding ten times.

The shape of the transparent fluorescent sialon ceramic of Experiment Example 6 was columnar. Further, the transparent fluorescent sialon ceramic of Experiment Example 6 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 6, the linear transmittance of visible light was measured in the same manner as in Experiment Example 1. The results are shown in Table 1 and FIG. 6.

(Measurement of Emission Spectrum and Excitation Spectrum)

With respect to the transparent fluorescent sialon ceramic of Experiment Example 6, the emission spectrum and the excitation spectrum were measured in the same manner as in Experiment Example 1. The measurement results of the emission wavelength peak and the excitation wavelength peak are shown in Table 1.

Experiment Example 7

(Production of Transparent Fluorescent Sialon Ceramic)

A transparent fluorescent sialon ceramic of Experiment Example 7 was obtained in the same manner as in Experiment Example 5 except that phenolic resin spherical powder (trade name: R800, average particle diameter: 20 to 50 μm, manufactured by AIR WATER INC.) was added as a pore-forming agent such that the mass ratio between the phenolic resin spherical powder and silicon nitride ($Si_3N_4$) powder which was one of the sialon raw material powder became 92:3.

The shape of the transparent fluorescent sialon ceramic of Experiment Example 7 was columnar. Further, the transparent fluorescent sialon ceramic of Experiment Example 7 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 7, the linear transmittance of visible light was measured in the same manner as in Experiment Example 1. The results are shown in Table 1 and FIG. 6.

(Measurement of Emission Spectrum and Excitation Spectrum)

With respect to the transparent fluorescent sialon ceramic of Experiment Example 7, the emission spectrum and the excitation spectrum were measured in the same manner as in Experiment Example 1. The measurement results of the emission wavelength peak and the excitation wavelength peak are shown in Table 1.

Experiment Example 8

(Production of Transparent Fluorescent Sialon Ceramic)

A transparent fluorescent sialon ceramic of Experiment Example 8 was obtained in the same manner as in Experiment Example 7 except that a secondary molded body was obtained by cold isostatic press molding ten times.

The shape of the transparent fluorescent sialon ceramic of Experiment Example 8 was columnar. Further, the transparent fluorescent sialon ceramic of Experiment Example 8 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 8, the linear transmittance of visible light was measured in the same manner as in Experiment Example 1. The results are shown in Table 1 and FIG. 6.

(Measurement of Emission Spectrum and Excitation Spectrum)

With respect to the transparent fluorescent sialon ceramic of Experiment Example 8, the emission spectrum and the excitation spectrum were measured in the same manner as in Experiment Example 1. The measurement results of the emission wavelength peak and the excitation wavelength peak are shown in Table 1.

Experiment Example 9

(Production of Transparent Fluorescent Sialon Ceramic)

A transparent fluorescent sialon ceramic of Experiment Example 9 was obtained in the same manner as in Experiment Example 5 except that phenolic resin spherical powder was added as a pore-forming agent such that the mass ratio between the phenolic resin spherical powder and silicon nitride ($Si_3N_4$) powder which was one of the sialon raw material powder became 92:5.

The shape of the transparent fluorescent sialon ceramic of Experiment Example 9 was columnar. Further, the transparent fluorescent sialon ceramic of Experiment Example 9 was thinned by machining and the final thickness thereof was set to 100 μm. When the thickness thereof was adjusted to be smaller, both-sided mirror surface polishing was performed.

(Measurement of Transmittance)

Figure 6:
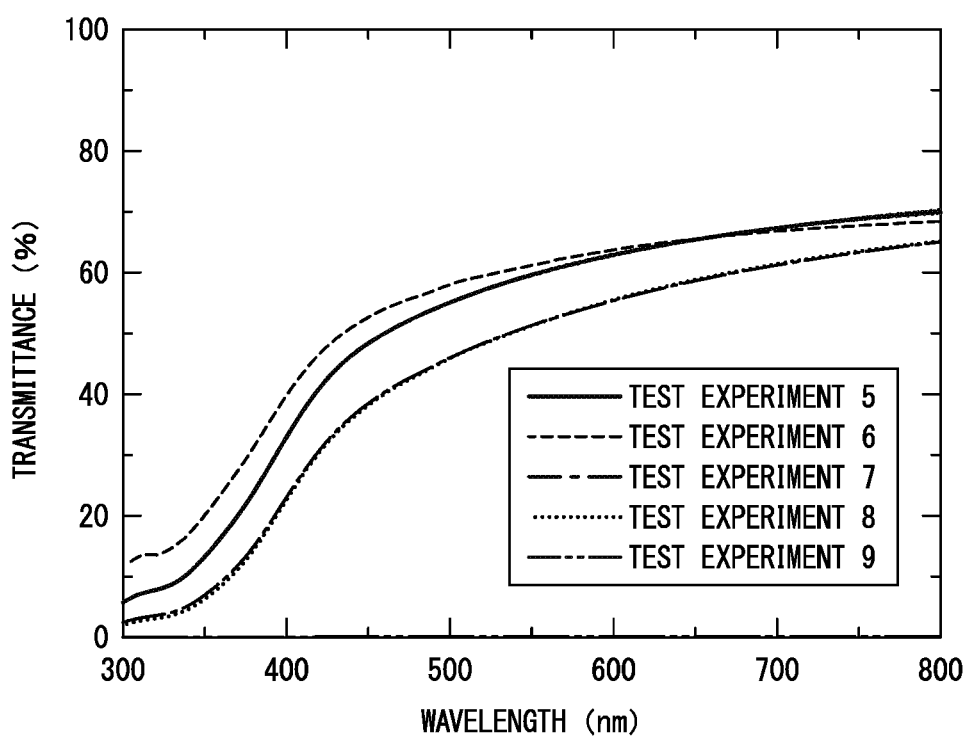
FIG. 6 is a graph showing measurement results of transmittances of visible light in transparent fluorescent sialon ceramics of Experiment Examples 5 to 9.

With respect to the transparent fluorescent sialon ceramic of Experiment Example 9, the linear transmittance of visible light was measured in the same manner as in Experiment Example 1. The results are shown in FIG. 6.

(Measurement of Emission Spectrum and Excitation Spectrum)

With respect to the transparent fluorescent sialon ceramic of Experiment Example 9, the emission spectrum and the excitation spectrum were measured in the same manner as in Experiment Example 1. The measurement results of the emission wavelength peak and the excitation wavelength peak are shown in Table 1.

Experiment Example 10

(Production of Transparent Fluorescent Sialon Ceramic)

A transparent fluorescent sialon ceramic of Experiment Example 10 was obtained in the same manner as in Experiment Example 5 except that silicon nitride ($Si_3N_4$) powder, aluminum nitride (AlN) powder, cerium (IV) oxide ($CeO_2$), and yttrium (III) oxide ($Y_2O_3$) were weighed so as to have a molar ratio of 21:9:0.5:1 (=$Si_3N_4$:AlN:$CeO_2$:$Y_2O_3$) and performing cold isostatic press molding ten times, thereby obtaining a secondary molded body.

The shape of the transparent fluorescent sialon ceramic of Experiment Example 10 was columnar. Further, the transparent fluorescent sialon ceramic of Experiment Example 10 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 10, the linear transmittance of visible light was measured in the same manner as in Experiment Example 1. The results are shown in Table 1.

(Measurement of Emission Spectrum and Excitation Spectrum)

Figure 7:
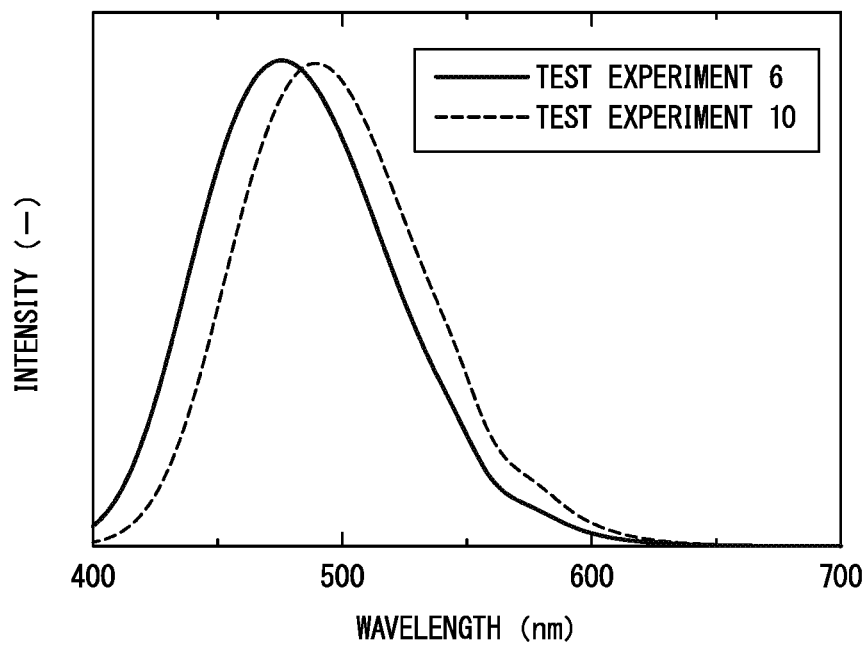
FIG. 7 is a graph showing measurement results of an emission spectrum in transparent fluorescent sialon ceramics of Experiment Examples 6 and 10.
Figure 8:
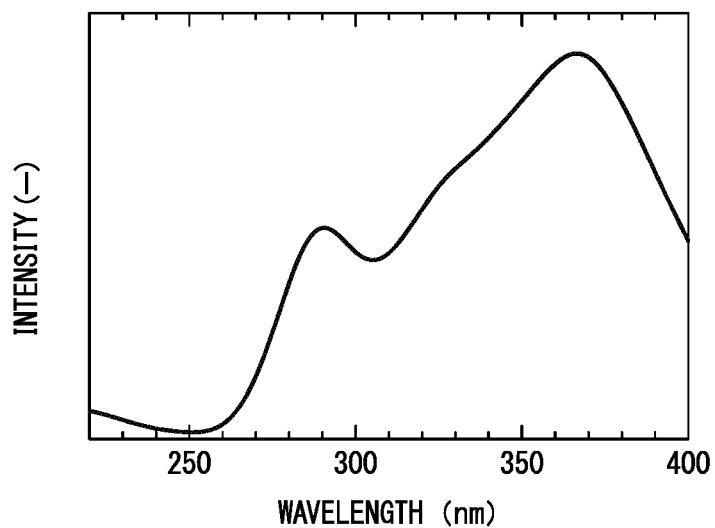
FIG. 8 is a graph showing a measurement result of an excitation spectrum in the transparent fluorescent sialon ceramic of Experiment Example 6.

With respect to the transparent fluorescent sialon ceramic of Experiment Example 10, the emission spectrum and the excitation spectrum were measured in the same manner as in Experiment Example 1. The measurement result of the emission spectrum is shown in FIG. 7 and the measurement result of the excitation spectrum is shown in FIG. 8.

Further, the measurement results of the emission wavelength peak and the excitation wavelength peak are shown in Table 1.

Experiment Example 11

(Production of Transparent Fluorescent Sialon Ceramic)

First, silicon nitride ($Si_3N_4$) powder (trade name: SN-E10, manufactured by UBE INDUSTRIES, LTD., purity >98%, average particle diameter: 0.6 μm), aluminum nitride (AlN) powder (manufactured by Tokuyama Corporation, F grade, purity >98%, average particle diameter: 1.29 μm), yttrium (III) oxide ($Y_2O_3$) (trade name: RU-P, manufactured by Shin-Etsu Chemical Co., Ltd., purity >99.9%, average particle diameter: 1.1 μm), and europium (III) oxide ($Eu_2O_3$) (manufactured by Shin-Etsu Chemical Co., Ltd.) were weighed so as to have a molar ratio of 21:9:0.9:0.1 (=$Si_3N_4$:AlN:$Y_2O_3$:$Eu_2O_3$).

Next, 2% by mass of a dispersant (trade name: SERNA E503, manufactured by CHUKYO YUSHI CO., LTD., polyacrylic acid) was added to the total amount of the raw material powder, wet mixing was performed in ethanol at a rotation speed of 110 rpm for 48 hours using a ball mill (pot: made of polystyrene, internal volume: 250 mL, sialon ball: particle diameter of 5 mm, 700 pieces), thereby preparing a slurry containing raw material powder.

Subsequently, the obtained slurry was heated using a heater such as a mantle heater and ethanol contained in the slurry was sufficiently evaporated, thereby obtaining a mixture of raw material powder (mixed powder).

Next, a sieve of #32 (nominal dimension: 500 μm) and a sieve of #48 (nominal dimension: 300 μm) were used in this order, the above-described mixed powder was forcedly passed through these sieves, and the mixed powder having a predetermined particle diameter was granulated.

Subsequently, sufficiently melted paraffin (manufactured by Junsei Chemical Co., Ltd., melting point of 46° C. to 48° C.) as a binder, bis(2-ethylhexyl)phthalate (manufactured by Wako Pure Chemical Industries, Ltd., purity of 97.0%) as a lubricant, and cyclohexane (manufactured by Wako Pure Chemical Industries, Ltd., purity of 99.5%) as a solvent were sufficiently stirred and mixed with each other, thereby preparing a binder solution. Here, the amount of paraffin to be added was set to 4% by mass and the amount of bis(2-ethylhexyl)phthalate to be added was set to 2% by mass with respect to the total amount of raw material powder. Further, the amount of cyclohexane to be added was set to 35 mL/100 g.

Next, the granulated mixed powder was added to the binder solution, the binder solution was mixed into the entire mixed powder such that the binder solution permeated into the entire mixed powder, the mixture was heated, and then the solvent was evaporated.

Subsequently, after the solvent was sufficiently evaporated, the mixed powder was forcedly passed through a sieve of #60 (nominal dimension: 250 μm) and then granulated powder having a predetermined particle diameter was obtained.

Next, 0.7 g of granulated powder was collected such that the thickness of a molded body after molding using a stainless steel mold in a cylindrical shape having a diameter of 15 mm became 2 mm and then the granulated powder was supplied into the mold.

Subsequently, uniaxial press molding was performed at a pressure of 500 MPa for 30 seconds using a uniaxial press molding machine (trade name: MP-500H, manufactured by MARUTO INSTRUMENT CO., LTD.), thereby obtaining a primary molded body.

Next, the obtained primary molded body was chamfered and packed in a vacuum pack.

Subsequently, the primary molded body packed in a vacuum pack was molded by repeatedly performing cold isostatic pressing ten times at a pressure of 200 MPa for 60 seconds using a cold isostatic pressing device (trade name: SE-HANDY CIP50-2000, manufactured by Applied Power Japan, Ltd.), thereby obtaining a secondary molded body.

Next, the secondary molded body was placed on an alumina boat, heated in an air stream of 70 L/min using a tabular resistance furnace, and degreased, and a binder included in the secondary molded body was removed. In the degreasing process, heating was carried out at 500° C. for 3 hours.

Moreover, in order to promote evaporation of a binder or a lubricant included in the secondary molded body to some extent or to prevent carbon from remaining due to thermal decomposition of the binder or the lubricant, the secondary molded body was heated at 250° C. for 3 hours.

Next, the degreased secondary molded body was pre-sintered in a nitrogen atmosphere using a multi-purpose high-temperature sintering furnace (trade name: HIGH MULTI 5000, manufactured by Fujidempa Kogyo Co., Ltd.), thereby obtaining a sintered body.

In order to sinter the secondary molded body, a porous crucible made of $Si_3N_4$, which was prepared by reaction sintering, was disposed in a housing made of carbon, a porous column plate made of $Si_3N_4$ was disposed in the crucible, and the secondary molded body was disposed on the column plate.

In this sintering process, the temperature was increased at 20° C./min in a vacuum (6.7×10-2 Pa or less) in a temperature range of room temperature to 1200° C., the secondary molded body was pressed by nitrogen gas up to 0.25 MPa at 1200° C. and pressed with a nitrogen gas flow of 4 L/min up to 0.9 MPa while the temperature was increased at 10° C./min from 1200° C. to 1600° C. The sintered body prepared by setting the sintering temperature of the secondary molded body to 1700° C. and the sintering condition to 2 hours was left to be naturally cooled to room temperature and then cooled after the sintering was finished. Subsequently, the sintered body was subjected to a pressure-sintering treatment at 100 MPa and 1600° C. for 1 hour in a nitrogen atmosphere using a hot isostatic pressing processing device (trade name: SYSTEM15X, manufactured by KOBE STEEL LTD.), thereby obtaining a transparent fluorescent sialon ceramic of Experiment Example 11.

The shape of the transparent fluorescent sialon ceramic of Experiment Example 11 was columnar. Further, the transparent fluorescent sialon ceramic of Experiment Example 11 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 11, the linear transmittance of visible light was measured in the same manner as in Experiment Example 1. The results are shown in Table 1.

(Measurement of Emission Spectrum and Excitation Spectrum)

With respect to the transparent fluorescent sialon ceramic of Experiment Example 11, the emission spectrum and the excitation spectrum were measured in the same manner as in Experiment Example 1. The measurement results of the emission wavelength peak and the excitation wavelength peak are listed in Table 1.

Experiment Example 12

(Production of Transparent Fluorescent Sialon Ceramic)

A transparent fluorescent sialon ceramic of Experiment Example 12 was obtained in the same manner as in Experiment Example 11 except that silicon nitride ($Si_3N_4$) powder (trade name: SN-E10, manufactured by UBE INDUSTRIES, LTD., purity >98%, average particle diameter: 0.6 μm), aluminum nitride (AlN) powder (manufactured by Tokuyama Corporation, F grade, purity >98%, average particle diameter: 1.29 μm), yttrium (III) oxide ($Y_2O_3$) (trade name: RU-P, manufactured by Shin-Etsu Chemical Co., Ltd., purity >99.9%, average particle diameter: 1.1 μm), $CaCO_3$ (manufactured by Junsei Chemical Co., Ltd.), and europium (III) oxide ($Eu_2O_3$) (manufactured by Shin-Etsu Chemical Co., Ltd) were weighed so as to have a molar ratio of 21:9:0.675:0.45:0.1 (=$Si_3N_4$:AlN:$Y_2O_3$:$CaCO_3$:$Eu_2O_3$).

(Measurement of Transmittance)

With respect to the transparent fluorescent sialon ceramic of Experiment Example 12, the linear transmittance of visible light was measured in the same manner as in Experiment Example 1. The results are shown in Table 1.

(Measurement of Emission Spectrum and Excitation Spectrum)

Figure 9:
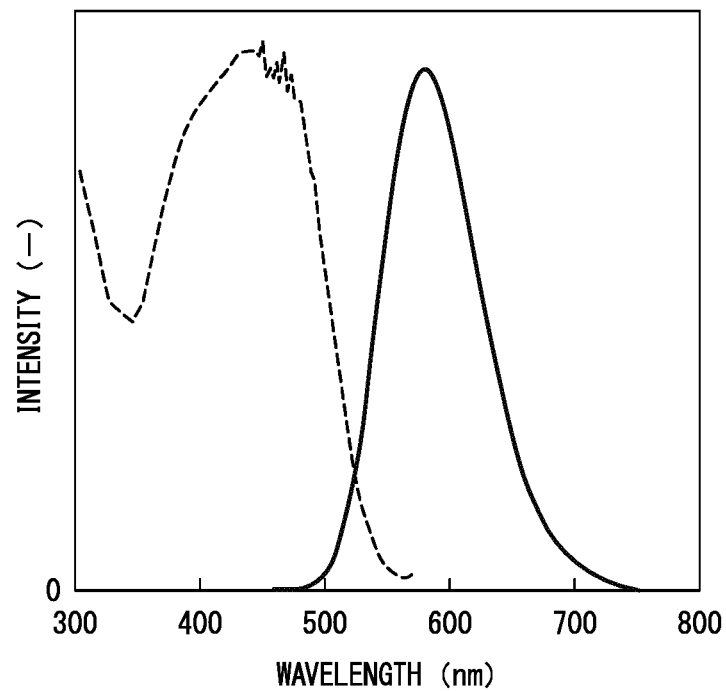
FIG. 9 is a graph showing a measurement result of an excitation spectrum in a transparent fluorescent sialon ceramic of Experiment Example 12.

With respect to the transparent fluorescent sialon ceramic of Experiment Example 12, the emission spectrum and the excitation spectrum were measured in the same manner as in Experiment Example 1. The measurement results of the emission wavelength peak and the excitation wavelength peak are shown in Table 1 and FIG. 9.

Experiment Example 13

(Production of Transparent Fluorescent Sialon Ceramic)

First, silicon nitride ($Si_3N_4$) powder (trade name: SN-E10, manufactured by UBE INDUSTRIES, LTD., purity >98%, average particle diameter: 0.6 μm), aluminum nitride (AlN) powder (manufactured by Tokuyama Corporation, H grade, purity >98%, average particle diameter: 1.29 μm), europium oxide (III) ($Eu_2O_3$) (manufactured by Shin-Etsu Chemical Co., Ltd.), and calcium nitride ($Ca_3N_2$) (manufactured by SIGMA-ALDLICH Corporation) were weighed so as to have a molar ratio of 1:1:0.016:0.984 (=Si:Al:Eu:Ca).

Next, the raw material powder was dry-mixed using a ball mill for 5 hours and a bottle was filled with the obtained mixed powder. The operations of weighing, mixing and filling of the raw material powder were all carried out in a glove box.

Subsequently, 3 g of the mixed powder fills the bottle in a graphitic type having a diameter of 25 mm, and a BN plate was interposed between a punch bar of graphite and a sample, uniaxially pressed at 30 MPa, and fired using a spark plasma sintering device (trade name: SPS-1050, manufactured by Fuji Electronic Industries Co., Ltd.) to prepare a sintered body, thereby obtaining a transparent fluorescent sialon ceramic of Experiment Example 13.

The sintering temperature was set to 1760° C., the sintering time was set to 10 minutes, and the sintering was carried out in a nitrogen gas atmosphere.

The shape of the transparent fluorescent sialon ceramic of Experiment Example 13 was columnar. Further, the transparent fluorescent sialon ceramic of Experiment Example 12 was thinned by machining and the final thickness thereof was set to 100 μm. When the thickness thereof was adjusted to be smaller, both-sided mirror surface polishing was performed.

(Measurement of Transmittance)

With respect to the transparent fluorescent sialon ceramic of Experiment Example 13, the linear transmittance of visible light was measured in the same manner as in Experiment Example 1. The results are shown in Table 1.

(Measurement of Emission Spectrum and Excitation Spectrum)

Figure 10:
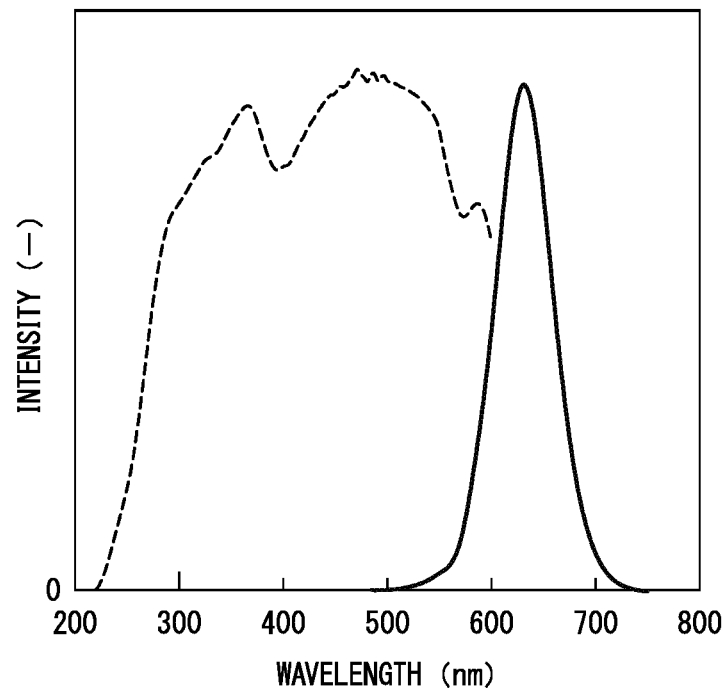
FIG. 10 is a graph showing a measurement result of an excitation spectrum in a transparent fluorescent sialon ceramic of Experiment Example 13.

With respect to the transparent fluorescent sialon ceramic of Experiment Example 13, the emission spectrum and the excitation spectrum were measured in the same manner as in Experiment Example 12. In measurement of the emission spectrum and the excitation spectrum, the measurement wavelength region was set such that the emission spectrum was excited at 471 nm and was in a range of 485 nm to 750 nm and the excitation spectrum was excited at 633 nm and was in a range of 220 nm to 600 nm using FP6300 (manufactured by Jasco Corporation). The results thereof are shown in FIG. 10. Further, the measurement results of the emission wavelength peak and the excitation wavelength peak are listed in Table 1.

TABLE 1

| Experiment Example | Compound name | Thickness [μm] | Excitation wavelength peak [nm] | Emission wavelength peak [nm] | Linear transmittance (800 nm) [%] |
|---|---|---|---|---|---|
| 1 | β-SiAlON:Eu | 100 | 313 | 535.5 | 11 |
| 2 | β-SiAlON:Eu | 100 | 305.5 | 532 | 18 |
| 5 | Y-αSiAlON:Ce | 100 | 367.5 | 476.5 | 70 |
| 6 | Y-αSiAlON:Ce | 100 | 366.5 | 476.5 | 68 |
| 7 | Y-αSiAlON:Ce | 100 | 368.5 | 477.5 | 65 |
| 8 | Y-αSiAlON:Ce | 100 | 368.5 | 478.5 | 65 |
| 10 | Y-αSiAlON:Ce | 100 | 373.5 | 490.5 | 66 |
| 11 | Y-αSiAlON:Eu | 100 | 450 | 594 | 33 |
| 12 | Ca,Y-αSiAlON:Eu | 100 | 450 | 580 | 23 |
| 13 | $CaAlSiN_3$ | 100 | 471 | 633 | 19 |

As shown from the results of Table 1 and FIGS. 2, 3, and 4, the transparent fluorescent sialon ceramics of Experiment Examples 1 to 4 are capable of emitting green fluorescent light. Further, as shown from the results of Table 1 and FIGS. 5, 7, and 8, the transparent fluorescent sialon ceramics of Experiment Examples 5 to 11 are capable of emitting blue to blue-green fluorescent light. Further, as shown from the results of Table 1 and FIG. 9, the transparent fluorescent sialon ceramics of Experiment Examples 11 and 12 are capable of emitting yellow fluorescent light. Furthermore, as shown from the results of Table 1 and FIG. 10, the transparent fluorescent sialon ceramic of Experiment Example 13 is capable of emitting red fluorescent light.

From the results of FIG. 6, it was understood that the transmittance of visible light in the transparent fluorescent sialon ceramic is decreased when the amount of phenolic resin spherical powder to be added as a pore-forming agent is increased. It is considered that a decrease in transmittance is caused by fine pores, formed in the transparent fluorescent sialon ceramic, containing air due to addition of the phenolic resin spherical powder as a pore-forming agent. Further, it was understood that a difference in transmittance of visible light between the transparent fluorescent sialon ceramic obtained through cold isostatic press molding performed once and the transparent fluorescent sialon ceramic obtained through cold isostatic press molding performed ten times was not large.

Moreover, from the results of FIGS. 7 and 8, it was understood that the emission wavelength and the excitation wavelength in the transparent fluorescent sialon ceramic can be shifted by changing the amount of cerium (IV) oxide ($CeO_2$) to be added.

INDUSTRIAL APPLICABILITY

According to the present invention, it is possible to mold a transparent fluorescent sialon ceramic into a predetermined shape with the form as it is and to apply the molded transparent fluorescent sialon ceramic to a white LED. Further, it is not necessary for a sialon phosphor to be dispersed in a resin for use as in the related art, and it is possible to obtain a transparent fluorescent sialon ceramic in which the luminous efficiency of a white LED is not degraded due to scattering of light caused by a difference in refractive index between a sialon phosphor and a resin. Therefore, the present invention is extremely useful.

The invention claimed is:

1. A fluorescent sialon ceramic consisting of:
   a sialon phosphor in the form of a sintered bulk body, the sialon phosphor consisting of a matrix formed of β-sialon represented by the formula $(Si,Al)_6(N,O)_8$, and a luminescent center element,
   wherein the linear transmittance of visible light of the sintered bulk body is 11% or greater at a wavelength of 800 nm as measured with respect to a test specimen of the sintered bulk body having a thickness of 100 μm.

2. A method of producing a fluorescent sialon ceramic according to claim 1, the method comprising:
   preparing a primary molded body by uniaxial press molding of a mixture which contains at least silicon nitride powder, a substance serving as a luminescent center element source, and a sintering aid;
   preparing a secondary molded body by cold isostatic press molding of the primary molded body;
   preparing a sintered bulk body by pre-sintering the secondary molded body in a nitrogen atmosphere; and
   performing a pressure-sintering treatment on the sintered bulk body in a nitrogen atmosphere.

3. The method of producing a fluorescent sialon ceramic according to claim 2, wherein at least one member selected from the group consisting of rare earth oxides, alkaline earth metal oxides, aluminum oxide, aluminum nitride, silicon oxide, and hafnium oxide is used as the sintering aid.

4. The fluorescent sialon ceramic according to claim 1, wherein the luminescent center element is one selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe.

* * * * *